(12) United States Patent
Perisetty

(10) Patent No.: US 7,296,196 B2
(45) Date of Patent: Nov. 13, 2007

(54) REDUNDANT COLUMN READ IN A MEMORY ARRAY

(75) Inventor: Srinivas Perisetty, Santa Clara, CA (US)

(73) Assignee: Atmel Corporation, San Jose, CA (US)

( * ) Notice: Subject to any disclaimer, the term of this patent is extended or adjusted under 35 U.S.C. 154(b) by 206 days.

(21) Appl. No.: 11/131,017

(22) Filed: May 17, 2005

(65) Prior Publication Data
US 2007/0022330 A1   Jan. 25, 2007

(51) Int. Cl.
*G11C 29/00* (2006.01)
(52) U.S. Cl. .................. 714/710; 714/718; 365/201
(58) Field of Classification Search .................. None
See application file for complete search history.

(56) References Cited
U.S. PATENT DOCUMENTS 6,185,709 B1 *  2/2001  Dreibelbis et al. .......... 714/726
6,571,348 B1    5/2003  Tsai et al. .................... 714/6
6,603,688 B2 *  8/2003  Hasegawa et al. .......... 365/200

* cited by examiner

Primary Examiner—Phung My Chung
(74) Attorney, Agent, or Firm—Schneck & Schneck; Thomas Schneck

(57) ABSTRACT

A nonvolatile memory device requires no additional dummy bytes between receipt of a read instruction and a scanning out of data from a first target memory location requiring incorporation of redundant memory bits. A set of most significant redundant memory bits corresponding to a range of regular memory locations may be read speculatively after a particular set of the highest order address bits are received. After a complete address is received, any requirement for substitution of redundant memory bits is known. If no substitution is required, the regular memory contents are read. Any requirement for a substitution of memory bits may require replacement of the entire location. A regular read operation continues after the first location is read. In this way, complete and correct data for the memory location are available after receipt of a read instruction with no additional delay for including any required redundant memory bits.

11 Claims, 3 Drawing Sheets

Fig._1 (Prior Art)

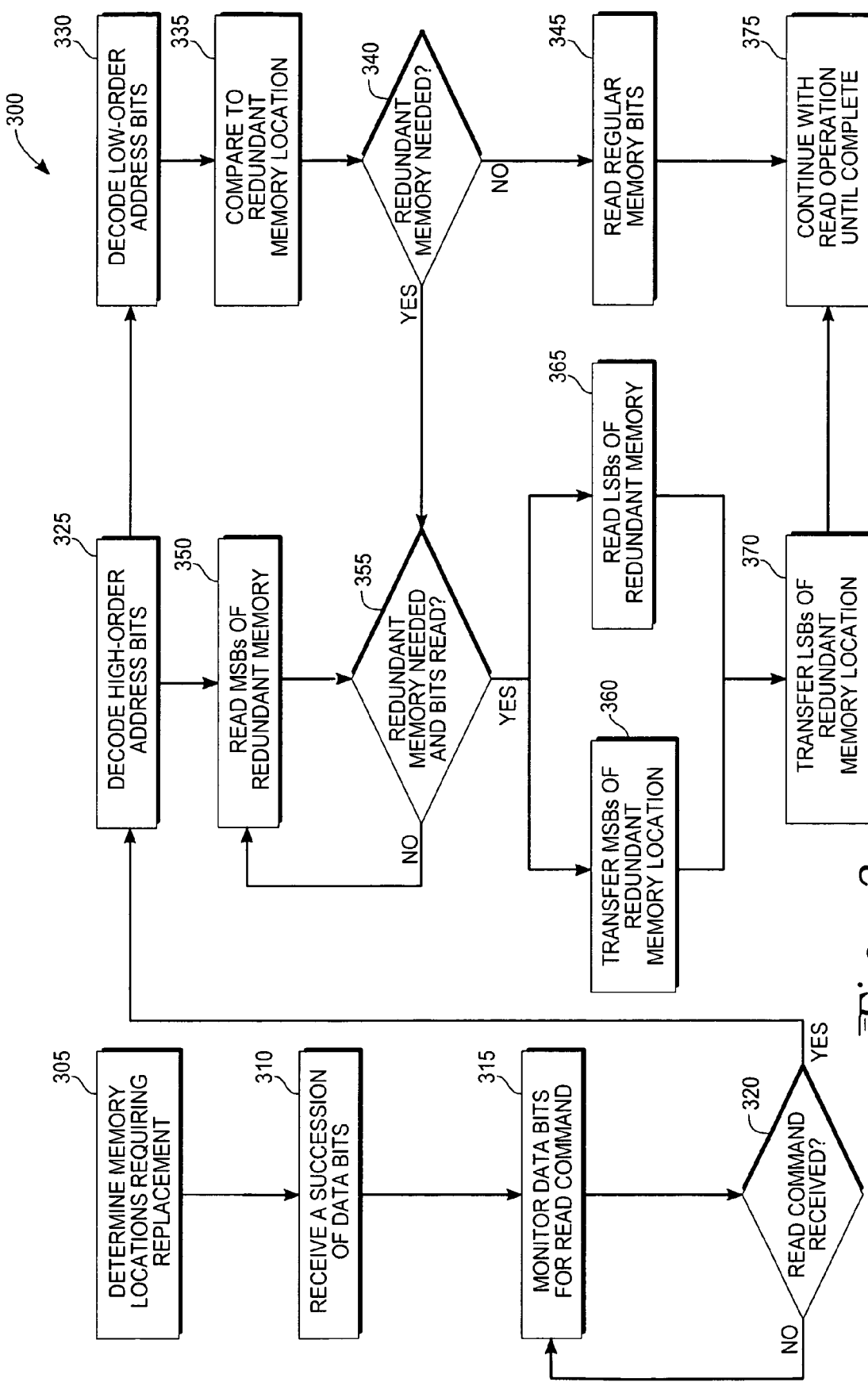
Fig. _ 3

REDUNDANT COLUMN READ IN A MEMORY ARRAY

TECHNICAL FIELD

The invention relates to nonvolatile memory and sequential read operations. More specifically, the invention reduces or eliminates any increase in read access delay in flash memory devices incorporating redundant memory.

BACKGROUND ART

Nonvolatile memories, known as flash memory devices, have become very popular in a variety of uses including mobile phones, digital answering machines, and personal digital voice recorders. Low pin count, low cost, and ease-of-use are key factors for the wide utilization of flash memory.

Contents of a sequential type of flash memory may be accessed by supplying an initial address and applying a number of clock cycles equal to the number of sequential addresses desired for access in a memory operation. An internal address counter automatically increments an access address with each clock. Data from sequential addresses are available with each successive clock cycle. This avoids any requirement of additional address sequencing externally. This capability allows sequential reading to cross page and sector boundaries seamlessly.

To conduct a continuous read operation in a nonvolatile memory device, a read command is given which includes a starting memory address. After allowing a period of time for internal read operations and address decoding, a first byte of data is available from the initial address given. If a redundant bit or bits are required, the read operation must incorporate any redundant memory bits used into a final data word before the data are output.

A drawback of reading continuously from prior sequential memories involving redundancy has been the amount of latency after a read command is entered until data are output. Access time is increased to accommodate reading redundant bits in addition to the bits of the original location. This is especially true when the number and cost of reading circuits is kept the same as a part without redundancy. The delay from read command input to data output degrades an efficiency of continuous read operations.

With reference to FIG. 1, a prior art nonvolatile memory 100 contains a memory array 105 including a plurality of bit memory blocks 115 organized in parallel to form data words. The memory array 105 also contains redundant bit memory blocks 117 that are incorporated when a faulty bit is detected.

An output of each bit memory block 115 connects to a corresponding position of a multiplexed register 122. Each bit memory block 115 is associated with two redundant bit memory blocks 117. Each redundant bit memory block 117 has an output connected to a corresponding location of the multiplexed register 122 at one of two additional positions per location. Each output of the multiplexed register 122 connects to an input of a sense amp register 120. Each output of the sense amp register 120 connects to a corresponding input location of a memory register 127. Outputs of the memory register 127 connect to a multiplexer (MUX) 133.

A clock generator 155 receives a clock signal from a serial clock (SCK) input 160. A serial data input (SI) 145 of the nonvolatile memory 100 connects to a controller 140. Commands, addresses, and data are received through the serial data input 145. The controller 140 provides control input to the clock generator 155, the multiplexed register 122, the sense amp register 120, the memory register 127, and an address decoder 150.

Three output lines of the clock generator 155 connect clocking signals, which are encoded to select one of eight possible values. A selection of the inputs to the multiplexer 133 is sequenced through under control of the signal values on the three clock output lines. An output of the multiplexer 133 connects to a serial output (SO) 135.

The controller 140 receives a continuous read command followed by three bytes of address information. The first two address bytes received determine a data byte location to the sector, block, and page level. After decoding the continuous read command, the controller 140 and address decoder 150 determine an initial memory location and connect the appropriate bit memory locations of the memory array 105 to the multiplexed register 122.

Locations requiring replacement of their contents by redundant memory 117 have been previously determined. With the initial memory location determined, the controller 140 compares the single memory location addressed with the previously determined locations requiring replacement of contents. A determination of a requirement for replacement of the initial memory location is made. If the initial memory location does not require replacement, a normal read operation occurs. If the initial memory location does require replacement, the entire location will be replaced by redundant memory.

After the determination of required replacement is made, the appropriate memory bits are read. The determination process may only begin after the location of the initial memory location is known. The initial memory location is known after complete address decoding. The time for complete address decoding and a determination of any replacement requirements means that dummy bytes may have to be inserted to an output stream of data for the device between the time the read instruction is received and the requested data can be output. In this way, the additional use of redundant memory may cause significant delays in receiving correct data.

For flash memories utilizing redundant memory bits, any increase in an amount of latency between the read command and data output is a significant impact to system efficiency. One desirable operation of flash memory would be to submit a continuous read operation command and have the data available in a normal amount of time regardless of whether redundant memory bits are incorporated or not.

DISCLOSURE OF INVENTION

An exemplary nonvolatile memory device, incorporating redundant memory bits, requires no addition of dummy bytes between receipt of a read command and a scanning out of memory bits from a first memory location. Memory device locations requiring replacement of faulty bits are determined before regular operation of the device. As a first portion of address bits of the read command is received, a first portion of redundant memory bits from corresponding redundant bit memory locations are multiplexed to a sense amp register for reading. The first portions of the redundant memory bits identified are completely read and stored in a memory register by the time the last portion of the byte address is received.

After receipt of a complete address, a single memory location is known. At this time any requirement for substitution of redundant memory bits is known by a comparison with the previously determined locations requiring replacement. If no substitution is required, the regular memory contents are read. Any requirement for substitution of memory bits requires replacement of the entire location. A regular read operation continues after the first location is read. In this way, complete and correct data for the memory location are available after a regular access time with no additional delay for including any required redundant memory bits.

After receiving the first portion of address bits, the remaining time for receiving a last portion of the target address bits allows for a speculative reading of the redundant memory bits corresponding to the target memory location. This speculative read operation allows a relatively slow read operation to be performed on the set of redundant memory bits during the time that the final address bits are received. Any redundant memory bits necessary are available without any additional delay for reading. Complete and correct data for the target location are scanned out with no additional latency compared to a device without redundancy.

BRIEF DESCRIPTION OF DRAWINGS

FIG. 3 is an exemplary process flow diagram of a continuous read operation of the nonvolatile memory of the exemplary block diagram of FIG. 2.

MODES FOR CARRYING OUT THE INVENTION

Figure 1:
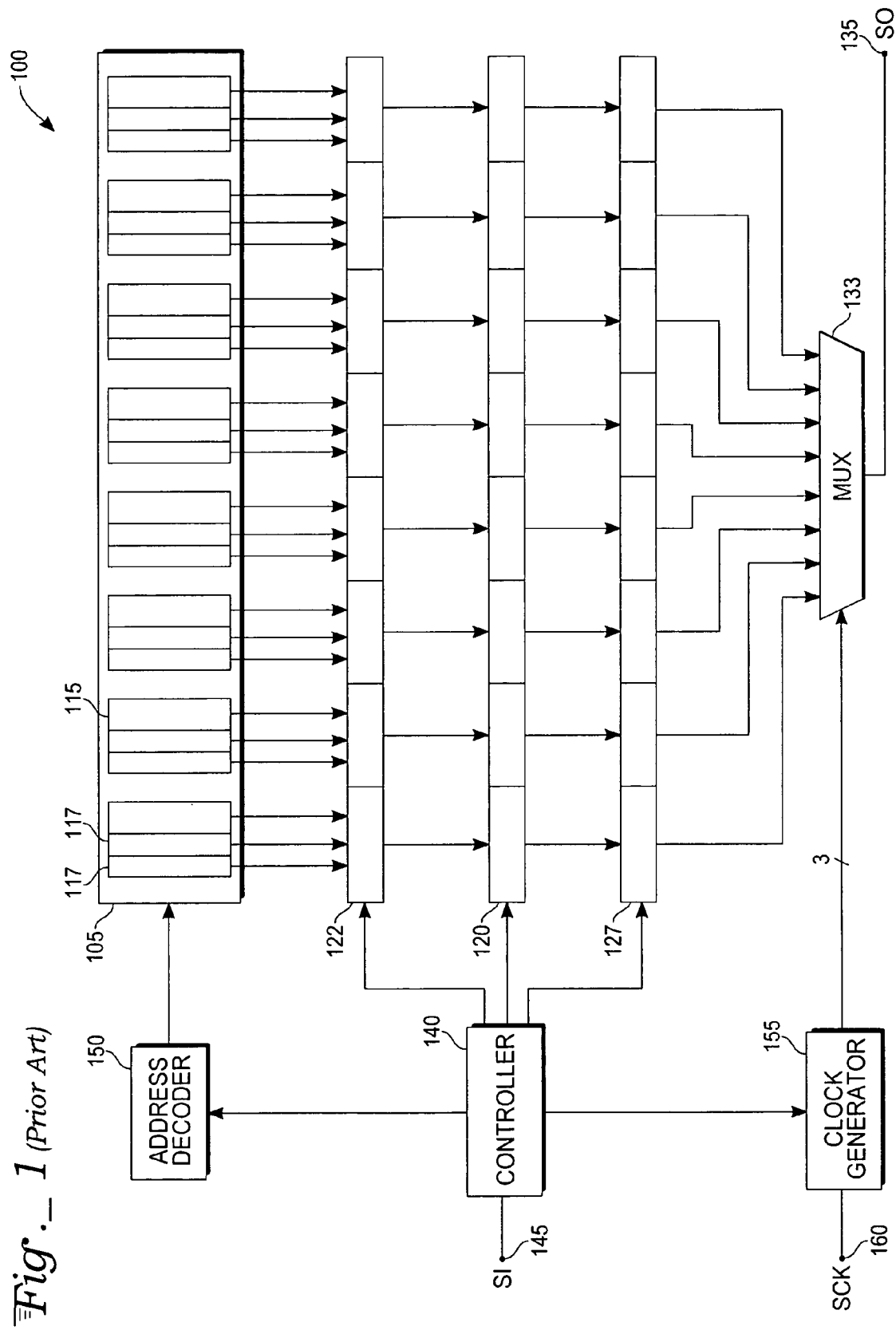
FIG. 1 is a block diagram of a prior art nonvolatile memory with memory bit redundancy and a multiplexed output.
Figure 2:
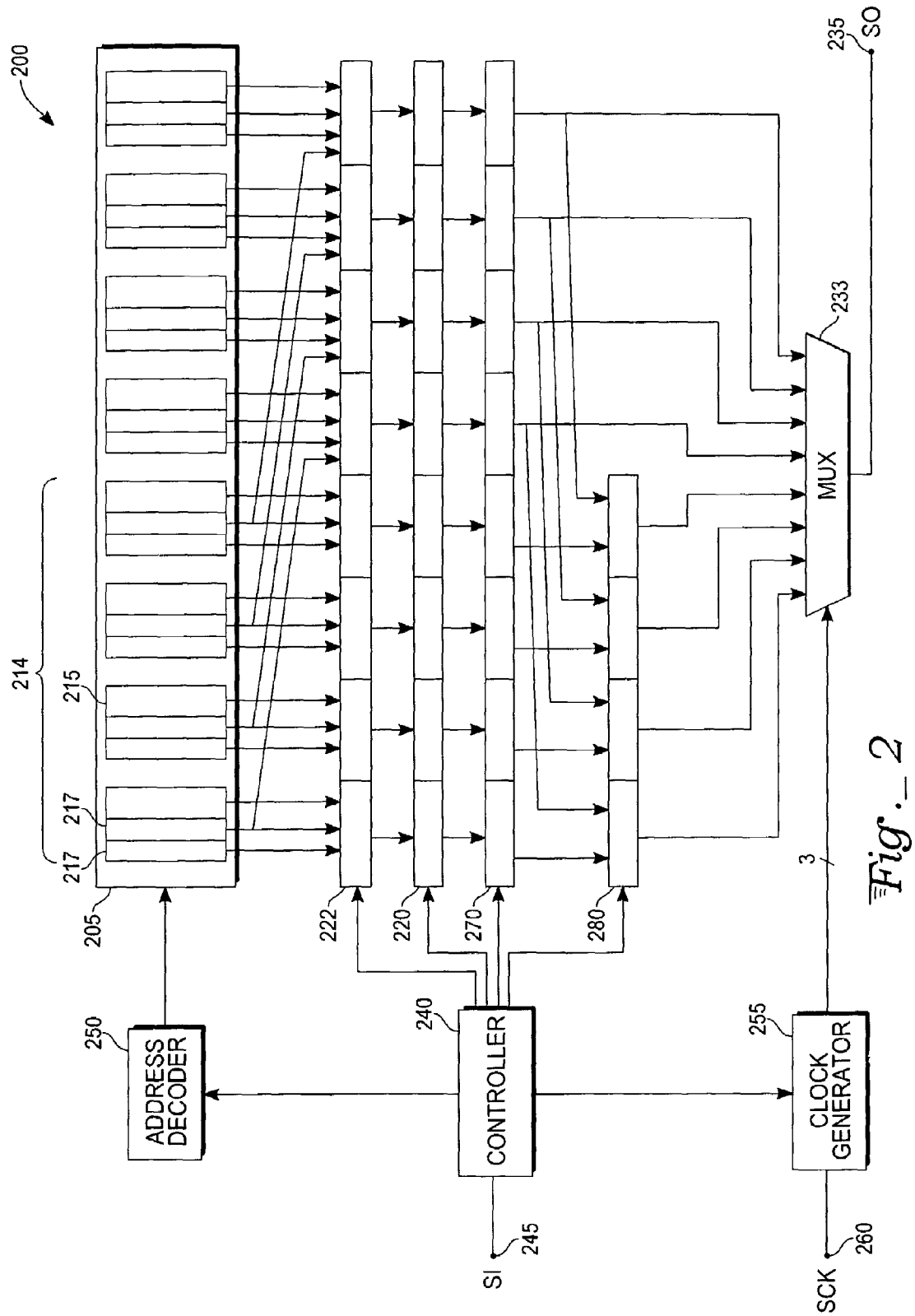
FIG. 2 is an exemplary block diagram of a nonvolatile memory of the present invention.

With reference to FIG. 2, an exemplary nonvolatile memory 200 of the present invention contains a memory array 205 including bit memory blocks 215 and redundant bit memory blocks 217. The memory array 205 is organized by memory locations taken from parallel bit positions across the bit memory blocks 215. Each memory location has a pair of redundant memory bits at a corresponding address in the redundant bit memory blocks 217.

At each bit position of the memory array 205, an output of each bit memory block 215 and an output of each of the pair of redundant bit memory blocks 217 is connected to a separate input of a corresponding bit position of a multiplexed register 222. At the four most significant bit positions 214 of the memory array 205, an output of a second one of the pair of redundant bit memory blocks 217 is routed to an input of one of four respective least significant bit positions of the multiplexed register 222.

Each output of the multiplexed register 222 connects to a respective input of a sense amp register 220. Each output of the sense amp register 220 connects to a respective input position of a memory register 270. At the memory register 270, the four most significant output bit positions connect to the respective four inputs of a second multiplexed register 280. Each of the four least significant positions of the memory register 270 has an output connected to a respective input position of the second multiplexed register 280. Each of the four least significant bit positions of the memory register 270 also connects to one of the four respective least significant bit positions of a multiplexer (MUX) 233. The four outputs of the second multiplexed register 280 connect to the respective four most significant bit positions of the multiplexer 233.

A controller 240 provides control input and connects to the multiplexed register 222, the sense amp register 220, the memory register 270, the second multiplexed register 280, an address decoder 250, and a clock generator 255. The controller 240 provides path selection through the multiplexed register 222 and the second multiplexed register 280, control of reading in the sense amplifier register 220, and control of latching in the memory register 270. By way of the clock generator 255, the controller 240 provides a selection of paths through the multiplexer 233. In an alternate embodiment (not shown) the controller and clock generator function may be combined, for example.

The clock generator 255 receives a clock signal from a serial clock (SCK) input 260. Three clock lines from the clock generator 255 connect to the multiplexer 233. The three output lines of the clock generator 255 carry encoded signals to select one of eight possible values at a time. Contents of the four bit positions of the second multiplexed register 280 and the four least significant bit positions of the memory register 270 are selected in a sequence by the multiplexer 233 for connection to a serial output (SO) 235.

A serial data input (SI) 245 of the nonvolatile memory 200 connects to the controller 240. Commands, addresses, and data are received through the serial data input 245. The controller 240 receives a continuous read command followed by three bytes of address information. At the time a continuous read command is decoded, the controller 240 uses a first portion of address bits (e.g., the first two of the three address bytes) to determine a set of redundant bit memory locations for reading speculatively.

The first two address bytes received determine a range of target memory locations within a sector, block, and page level. For an entire page, the redundant bit memory blocks 217 will be used to replace an entire byte where faulty bits have been determined to exist. After receipt of the first two address bytes, the associated redundant memory locations are known for a memory location which will eventually be decoded and which may require replacement. The four most significant pairs of redundant memory bits for the associated memory location are then read from the bit memory blocks 217 (connected as discussed supra). The four pairs of redundant memory bits are selected by the multiplexed register 222, read by the sense amp register 220, and stored in the memory register 270. In this way, a first portion of either possible redundant bit memory location is ready for scanning out if the eventual decoded location requires replacement.

After receiving all of the address bytes, the controller 240 decodes the single target memory location to be read. The target location is determined to be either a regular memory location or one requiring replacement by the redundant memory bits. If the target location is a regular memory location, data from the bit memory blocks 215 are selected by the multiplexed register 222, read by the sense amp register 220, and stored in the memory register 270. For the four most significant bits of the memory register 270, the data are passed through the second multiplexed register 280 and selected by the multiplexer 233 for transfer out of the serial output 235. The four least significant bits of the memory register 270 are connected directly to the multiplexer 233 for selection and transferring out of the serial output 235.

If the target memory location corresponds to a location requiring replacement by redundant memory, the four most significant bits to be used are selected from the corresponding four most significant bits coming from one of the two sets of four most significant redundant bit memory blocks 217. Both pairs of most significant redundant bits are stored in the memory register 270 as described supra. The appropriate set is selected by the second multiplexed register 280 and made available to the multiplexer 233 for sequential selection and transfer to the serial output 235. With both pairs of the four most significant redundant bits being read speculatively, there is no delay from the time the single target memory address is received and decoded to the time of transferring the associated redundant bits out.

The remaining four least significant redundant bits are selected by the multiplexed register 222 from the appropriate least significant positions of the redundant bit memory blocks 217 in the memory array 205. The four least significant redundant bits are read by the sense amplifier register 220, stored in the memory register 270 and are made available to the multiplexer 233 for transfer out. The selection, reading, and storage processes are carried-out during the time the four most significant redundant bits are being transferred out by the multiplexer 233. The time taken to transfer out the four most significant bits leaves time for the first of the least significant bits to be ready for transferring out. In this way a target memory location requiring redundant memory bit replacement is available with zero latency from the time the read command and address are received and decoded to the time the first redundant memory bit is transferred out.

Being a sequential type of memory, the second memory location address follows the first. Read operations continue in a regular sequential manner after the speculative read operation on the redundant memory bits for the first memory location. During the time the first memory location is read, the target memory location address is incremented and reading operations begin in parallel on the second target memory location or any corresponding redundant memory location that may be required. The second memory location or redundant memory location used is completely read and ready for transferring out by the time the last bit of the first byte is transferred. Any remaining data locations targeted by the continuous read operation are read in the same sequential manner as the second byte.

With reference to FIG. 3, memory locations requiring replacement with redundant memory contents are determined 305 in a process flow diagram 300 of an exemplary continuous read operation. The process continues with receiving 310 a succession of input data bits containing a continuous read instruction. The process monitors 315 the input stream of data bits for the continuous read instruction which contains a read command and address of an initial memory location. A determination 320 is made whether the read command has been received. If the read command is not received, the monitoring 315 of data bits continues.

The address of the initial memory location contains both high order and low order address bits. The high order address bits are decoded 325 to locate an address for reading 350 a set of most significant bits of redundant memory corresponding to regular memory locations possibly requiring replacement. The most significant bits will be read speculatively in preparation of an eventual determination for use in replacing faulty bits at a regular memory location. If a determination is made that the initial memory location is supplanted by a redundant memory location, the entire byte will be replaced by a selection of redundant memory bits.

Decoding 330 of the low order address bits proceeds concurrently with reading 350 a set of most significant bits of redundant memory. An initial location of memory bits to access is determined by the decoding 330 of the low order address bits. The initial memory location is compared 335 with any memory locations requiring replacement. A determination 340 is made whether the location is a regular memory location or needs to be replaced by the contents at a redundant memory location. If the location is not to be replaced by the contents of a redundant memory address, reading 345 of a regular memory location proceeds and, as appropriate, reading of regular memory locations or further redundant memory locations continues until the command completes.

If the content of the initial memory location is to be supplied from a redundant memory address then a determination 355 is made whether a redundant memory address is needed and a reading 350 of the most significant bits of the redundant memory has been completed. If all reading has not been completed, then reading 350 of the most significant bits of redundant memory continues. If the initial location needs replacement by the contents of a redundant memory address and the most significant bits have been read, then transferring 360 of the most significant bits of the redundant memory location to the serial output 235 (FIG. 2) begins.

Meanwhile, during the transferring 360 of the most significant bits, a concurrent reading 365 of the least significant bits of the redundant memory location commences. The process proceeds with a transferring 370 of the least significant bits of the redundant memory location to the serial output 235. The process continues 375 with the read operation until complete.

Although the present invention has been disclosed in terms of a particular data width, as being practiced in terms of a particular sequence and range of addresses for target memory locations, and as commencing on a particular byte address bit, a skilled artisan recognizes that a scope of the present invention is applicable across a range of target data word or byte widths, over a certain range of memory bit locations, and starting on a different bit of an address byte. Within these alternatives, a different range of target memory locations may be implicated, a different sense amp read time required, or a different number of redundant memory bits of a target memory location multiplexed out; therefore, even though these and other modifications are possible, the essential characteristics of the present invention are still valid and understood by a skilled artisan.

What is claimed is:

1. A memory device comprising:
    a bit memory array, said bit memory array having a plurality of bit memory locations;
    a redundant bit memory array, said redundant bit memory array having a plurality of redundant bit memory locations;
    a bit reading register configured to be coupled to said bit memory array and to said redundant bit memory array;
    a controller configured to address certain ones of said plurality of bit memory locations and certain ones of said redundant bit memory locations, said controller being further configured to selectively couple said bit memory array and said redundant bit memory array to said bit reading register and substitute a content of one or more of said redundant bit memory locations for an existing content of one or more of said plurality of bit memory locations, said controller coupled to said bit memory array, said redundant bit memory array, and said bit reading register; and
    wherein said controller is further configured to: receive a sequence of address bits within a succession of input data bits, address one or more redundant bit memory locations based on a first portion of said sequence of address bits received, couple said bit reading register to a first portion of redundant bit memory positions of said one or more redundant bit memory locations addressed, read a first portion of redundant memory bits from said first portion of redundant bit memory positions, and transfer out said first portion of redundant memory bits read.

2. The memory device of claim 1, wherein said controller is further configured to: receive a final portion of address bits within said sequence of address bits, address a memory location based on said final portion of address bits received, couple said bit reading register to each bit position of said memory location addressed, read a complete set of memory bits from said memory location, and transfer out said set of memory bits read.

3. The memory device of claim 1, wherein said controller is further configured to: receive a final portion of address bits within said sequence of address bits, address a single redundant bit memory location based on said final portion of address bits received, couple said bit reading register to each remaining redundant bit memory position, read a set of remaining redundant memory bits, and transfer out said set of remaining redundant memory bits read.

4. A method of reading a memory, the method comprising:
   decoding most significant address bits from a read instruction to access a set of redundant bit memory locations;
   reading one or more most significant bits of redundant memory bits from a first one of said set of redundant bit memory locations;
   decoding least significant address bits from said read instruction to determine an initial regular memory location to read;
   determining whether a redundant bit memory location substitution is needed for said initial regular memory location;
   transferring said one or more most significant redundant memory bits if a determination of needing redundant bit memory location substitution is true;
   reading one or more least significant bits of redundant memory bits from said first one of said set of redundant bit memory locations if a determination of needing redundant bit memory location substitution is true; and
   transferring said one or more least significant redundant memory bits if a determination of needing redundant bit memory location substitution is true.

5. The method of reading a memory of claim 4 further comprising determining whether any regular memory locations require replacement with redundant memory locations.

6. The method of reading a memory of claim 4 further comprising reading memory bits from a regular memory location if said substitution is not needed.

7. The method of reading a memory of claim 4 further comprising reading a next one or more sequential memory locations until said read instruction is complete.

8. A method of reading a memory, the method comprising:
   decoding most significant address bits from a read instruction to access a set of redundant bit memory locations;
   reading one or more least significant bits of redundant memory bits from a first one of said set of redundant bit memory locations;
   decoding least significant address bits from said read instruction to determine an initial regular memory location to read;
   determining whether a redundant bit memory location substitution is needed for said initial regular memory location;
   transferring said one or more least significant redundant memory bits if a determination of needing redundant bit memory location substitution is true;
   reading one or more most significant bits of redundant memory bits from said first one of said set of redundant bit memory locations if a determination of needing redundant bit memory location substitution is true; and
   transferring said one or more most significant redundant memory bits if a determination of needing redundant bit memory location substitution is true.

9. The method of reading a memory of claim 8 further comprising determining whether any regular memory locations require replacement with redundant memory locations.

10. The method of reading a memory of claim 8 further comprising reading memory bits from a regular memory location if said substitution is not needed.

11. The method of reading a memory of claim 8 further comprising reading a next one or more sequential memory locations until said read instruction is complete.

* * * * *